(12) United States Patent
Li

(10) Patent No.: US 10,775,673 B2
(45) Date of Patent: Sep. 15, 2020

(54) PIXEL STRUCTURE AND ARRAY SUBSTRATE

(71) Applicants: HKC CORPORATION LIMITED, Shenzhen, Guangdong (CN); CHONGQING HKC OPTOELECTRONICS TECHNOLOGY CO., LTD., Chongqing (CN)

(72) Inventor: Zeyao Li, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/318,331

(22) PCT Filed: Nov. 28, 2018

(86) PCT No.: PCT/CN2018/117942
§ 371 (c)(1),
(2) Date: Jan. 16, 2019

(87) PCT Pub. No.: WO2019/161688
PCT Pub. Date: Aug. 29, 2019

(65) Prior Publication Data
US 2019/0331967 A1    Oct. 31, 2019

(30) Foreign Application Priority Data
Feb. 26, 2018   (CN) .......................... 2018 2 0271972

(51) Int. Cl.
*H01L 51/05*  (2006.01)
*G02F 1/1343*  (2006.01)
(Continued)

(52) U.S. Cl.
CPC ...... *G02F 1/134309* (2013.01); *G02F 1/1368* (2013.01); *G02F 1/134363* (2013.01);
(Continued)

(58) Field of Classification Search
CPC ............... H01L 27/124; H01L 27/1255; H01L 27/14605; H01L 27/14643; H01L 27/283;
(Continued)

(56) References Cited

U.S. PATENT DOCUMENTS 8,902,392 B2* 12/2014 Cho ................. G02F 1/133707
349/141
9,563,080 B2* 2/2017 Ryu ................. G02F 1/133711
(Continued)

FOREIGN PATENT DOCUMENTS

CN    101738802 A    6/2010
CN    203480175 U    3/2014
(Continued)

OTHER PUBLICATIONS

Wenjie Yao, the ISA written comments, Feb. 2019, CN.

*Primary Examiner* — Stephen W Smoot

(57) ABSTRACT

The present application provides a pixel structure and an array substrate. The pixel structure includes: a pixel structure, which includes: an electronic switching device; a pixel electrode electrically connected to the electronic switching device, in which the pixel electrode includes a plurality of sub-pixel electrode regions, and the transmittances of the plurality of sub-pixel electrode regions are different; a gate line disposed on a lateral side of the pixel electrode and electrically connected to the electronic switching device; and a data line disposed on another lateral side of the pixel electrode and electrically connected to the electronic switching device.

17 Claims, 5 Drawing Sheets

(51) Int. Cl.
  *G02F 1/1362* (2006.01)
  *G02F 1/1368* (2006.01)
  *H01L 27/28* (2006.01)
  *H01L 27/146* (2006.01)

(52) U.S. Cl.
  CPC .. *G02F 1/136227* (2013.01); *G02F 1/136286* (2013.01); *H01L 27/14605* (2013.01); *H01L 27/283* (2013.01); *H01L 51/0512* (2013.01); *H01L 51/0562* (2013.01); *G02F 2001/134345* (2013.01); *G02F 2201/122* (2013.01); *G02F 2201/123* (2013.01); *G02F 2201/40* (2013.01)

(58) Field of Classification Search
  CPC .......... H01L 51/0512; G02F 1/134309; G02F 1/134363; G02F 1/136227; G02F 1/136286; G02F 1/1368; G02F 2001/134345; G02F 2201/122; G02F 2201/123
  See application file for complete search history.

(56) References Cited

U.S. PATENT DOCUMENTS

| | | | |
|---|---|---|---|
| 2009/0135321 A1* | 5/2009 | Su | G02F 1/134336 349/37 |
| 2011/0181824 A1 | 7/2011 | Nagano | |
| 2014/0184973 A1* | 7/2014 | Kim | G02F 1/136209 349/43 |
| 2014/0204326 A1* | 7/2014 | Wu | G02F 1/133707 349/143 |
| 2018/0095333 A1* | 4/2018 | Lin | G02F 1/134327 |
| 2018/0294281 A1* | 10/2018 | Gan | H01L 27/124 |
| 2018/0373105 A1* | 12/2018 | Zhang | G09G 3/3648 |

FOREIGN PATENT DOCUMENTS

| | | |
|---|---|---|
| CN | 104035247 A | 9/2014 |
| CN | 107015403 A | 8/2017 |
| CN | 207020431 U | 2/2018 |
| CN | 208156379 U | 11/2018 |

\* cited by examiner

PIXEL STRUCTURE AND ARRAY SUBSTRATE

CROSS-REFERENCE TO RELATED APPLICATIONS

The present application is a U.S. National Stage of International Patent Application No. PCT/CN2018/117942 filed on Nov. 28, 2018 by Zeyao Li, et al. entitled, "Pixel Structure and Array Substrate", which claims priority to Chinese Patent Application No. 201820271972.8 filed on Feb. 26, 2018, entitled "pixel structure and array substrate", both of which are incorporated herein by reference as if reproduced in their entireties.

BACKGROUND

Technical Field

The present application pertains to the technical field of displays, and particularly relates to a pixel structure and an array substrate.

Description of Related Art

The statements herein merely provide background information related to the present application and do not necessarily constitute prior art. With the continuous development of science and technology, various display devices have emerged in an endless stream, bringing great convenience to people's production and life. For example, there is a thin film transistor (TFT)-liquid crystal display (LCD). A multi-domain pixel electrode structure is generally used to tilt the liquid crystal molecules in a plurality of different directions after alignment, thereby effectively improving the transmittance of the backlight, which is applicable to display devices with wide viewing angles to solve the color shift phenomenon of the display devices with wide viewing angles.

When a multi-domain pixel electrode structure is adopted it is usually required to perform switching control to different regions of the pixel electrodes by using a plurality of TFTs, and the plurality of TFTs occupy more pixel area, thereby reducing the aperture ratio of the entire display device, and the reduced aperture ratio will reduce the frame quality of the display device.

SUMMARY

In view of this, the embodiments of the present application provide a pixel structure and an array substrate, to solve the following problem including but not limited to: when a multi-domain pixel electrode structure is adopted, it is usually required to perform switching control to different regions of the pixel electrodes by using a plurality of TFTs. The plurality of TFTs occupy more pixel area, thereby reducing the aperture ratio of the entire display device, and the reduced aperture ratio will reduce the display effect of the display device.

An embodiment of the present application provides a pixel structure, which includes: an electronic switching device; a pixel electrode electrically connected to the electronic switching device, wherein the pixel electrode comprises a plurality of sub-pixel electrode regions, and transmittances of the plurality of sub-pixel electrode regions are different; a gate line disposed at a lateral side of the pixel electrode and electrically connected to the electronic switching device; and a data line disposed at another lateral side of the pixel electrode and electrically connected to the electronic switching device.

In some embodiments, the sub-pixel electrode regions include: a closed electrode frame composed of a plurality of peripheral electrode lines connected end to end, wherein adjacent sub-pixel electrode regions share the same one peripheral electrode line; and a plurality of orientated electrode lines obliquely disposed within the closed electrode frame, wherein the plurality of orientated electrode lines are parallel to each other with same line spacing and same line width.

In some embodiments, several sub-pixel electrode regions of the plurality of sub-pixel electrode regions constitute a main region of the pixel electrode, and the remaining sub-pixel electrode regions constitute a sub-region of the pixel electrode; wherein all sub-pixel electrode regions in the main region are adjacent to each other, and all sub-pixel electrode regions in the sub-region are adjacent to each other, and the line width of the orientated electrode lines in the main region is larger than the line width of the orientated electrode lines in the sub-region.

In some embodiments, a slit is formed on the peripheral electrode line located at the boundaries between the main region and the sub-region.

In some embodiments, the number of sub-pixel electrode regions comprised in the main region is equal to the number of sub-pixel electrode regions in the sub-region.

In some embodiments, the line spacing of the orientated electrode lines within the main region is larger than the line spacing of the orientated electrode lines within the sub-region.

In some embodiments, a slit is formed on the peripheral electrode line of the boundaries between the main region and the sub-region.

In some embodiments, the slit is formed on the peripheral electrode line by a process of hollowing out, etching, and cutting.

In some embodiments, the orientated electrode lines in adjacent sub-pixel electrode regions are symmetrically distributed with regard to a common peripheral electrode line.

In some embodiments, the number of sub-pixel electrode regions included in the pixel electrode is greater than or equal to four.

In some embodiments, the tilt directions of the orientated electrode lines in different sub-pixel regions are different.

In some embodiments, the orientated electrode lines within an odd row of sub-pixel electrode regions are inclined to the left, and the orientated electrode lines in an even row of sub-pixel electrode regions are inclined to the right; alternatively, the orientated electrode lines within an odd column of sub-pixel electrode regions are inclined to the left, and the orientated electrode lines in an even column of sub-pixel electrode regions are inclined to the right.

In some embodiments, the electronic switching device includes a gate, a drain, a source, and an active layer, and the active layer is disposed between the gate, and the drain and the source; the pixel electrode is electrically connected to the drain, the gate line is electrically connected to the gate, and the data line is electrically connected to the source.

In some embodiments, the pixel structure further includes: a gate insulation layer disposed between the active layer, and the gate and the gate line; and a protective layer disposed between the pixel electrode, and the data line, the source and the drain, and the pixel electrode is electrically connected to the drain through a through hole of the protective layer.

In some embodiments, the drain and the source are formed on a surface of the active layer, and the gate is formed on a lateral side of another surface of the active layer opposite to the source and the drain; the gate, the drain, and the source, together with the active layer, form the electronic switching device, and the gate and the gate line are formed at the same layer, and the source and the data line are formed at the same layer.

In some embodiments, the active layer is composed of a plurality of layers of different types of semiconductor materials.

In some embodiments, the active layer is an organic semiconductor active layer composed of three layers of different types of semiconductor materials.

In some embodiments, a parasitic capacitor is formed between the gate and the source of the electronic switching device.

In some embodiments, slits are formed on the peripheral electrode lines at the boundaries between adjacent sub-pixel electrode regions.

The present application further provides an array substrate, which includes: a substrate; and a plurality of pixel structures disposed on the substrate and arranged in an array, wherein adjacent gate lines are electrically connected and adjacent data lines are electrically connected; wherein, each of the pixel structures includes: an electronic switching device; a pixel electrode electrically connected to the electronic switching device, wherein the pixel electrode comprises a plurality of sub-pixel electrode regions, and transmittances of the plurality of sub-pixel electrode regions are different; a gate line disposed at a lateral side of the pixel electrode and electrically connected to the electronic switching device; and a data line disposed at another lateral side of the pixel electrode and electrically connected to the electronic switching device.

The embodiments of the present application can effectively reduce the display color shift and increase the aperture ratio, through providing a pixel structure including only one electronic switching device, and dividing a pixel electrode into a plurality of sub-pixel electrode regions, so that different sub-pixel electrode regions have different transmittances, thereby improving frame quality.

BRIEF DESCRIPTION OF THE DRAWINGS

In order to more clearly illustrate the technical solutions in embodiments of the present application, the drawings used in the description of the embodiments or the prior art will be briefly described below. Obviously, the drawings in the following description are only some embodiments of the present application, and other drawings may be obtained based on these drawings without creative works for those of ordinary skill in the art.

DETAILED DESCRIPTION

In order to make those skilled in the art better understand the solutions of the present application, the technical solutions in the embodiments of the present application are clearly described in the following with reference to the accompanying drawings in the embodiments of the present application. It is obvious that the described embodiments are only partial embodiments of the present application and are not all of the embodiments. Based on the embodiments of the present application, all other embodiments obtained by those skilled in the art without any creative work should fall within the scope of the present application.

The term "include/comprise" and any variation in the description, claims, and accompany drawings of the present application are intended to cover a non-exclusive inclusion. For example, a process, a method, or a system, a product or a device including a series of steps or elements is not limited to the listed steps or elements, but alternatively further includes steps or elements not listed, or alternatively further includes other steps or elements inherent to the process, method, product, or device. Moreover, the terms "first", "second" and "third" etc. are used to distinguish different objects and are not intended to describe a particular order.

Figure 1:
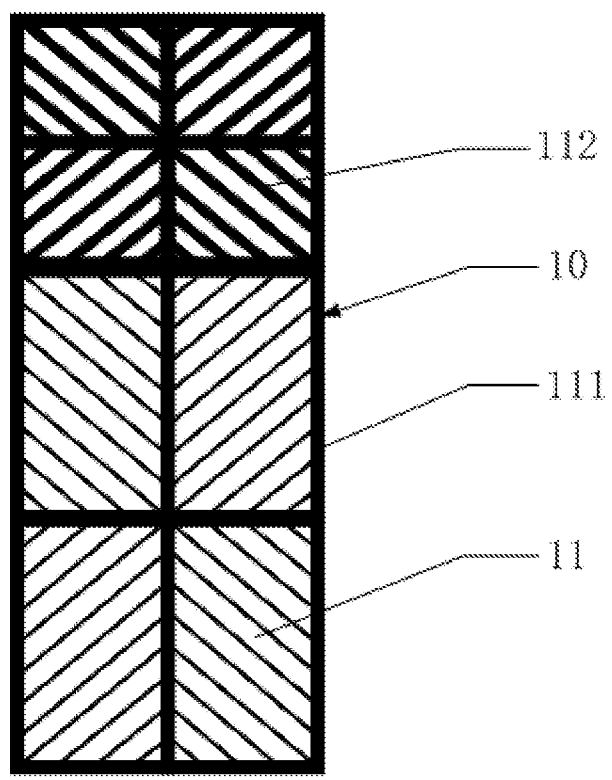
FIG. 1 is a structural schematic view of a pixel electrode provided in an embodiment of the present application.

As shown in FIG. 1, the embodiments of the present application provides a pixel electrode 10, which only needs to be electrically connected to a switching device when applied to a single pixel, an array substrate, or a display device, so that the driving of liquid crystal molecules in a single pixel may be realized under the premise of effectively reducing the color shift, thereby reducing the number of electronic switching devices required when the multi-domain pixel electrode structure is adopted, increasing the proportion of the light transmitting area to the entire pixel area, and reducing the aperture ratio; wherein, the aperture ratio is equal to light transmission area divided by pixel area.

In an application, the electronic switching devices may be any device that may be applied to a display device to implement an electronic switching function, for example, a bipolar junction transistor (BJT), a field effect transistor (FET), or a thin film transistor (TFT) or the like. When applied to a liquid crystal display, a thin film transistor may be selected.

In some embodiments, the pixel electrode is electrically connected to a drain electrode of the electronic switching device.

As shown in FIG. 1, in the present embodiment, the pixel electrode 10 includes a plurality of sub-pixel electrode regions, and the transmittances of different sub-pixel electrode regions are different.

In an application, the number of sub-pixel electrode regions may be arranged according to actual needs, and the number of sub-pixel electrode regions is the number of domains of the pixel electrode. For example, the two-domain pixel electrode includes two sub-pixel electrode regions, the four-domain pixel electrode includes four sub-pixel electrode regions, and the eight-domain pixel electrode includes eight sub-pixel electrode regions.

In some embodiments, the number of sub-pixel electrode regions included in the pixel electrode is greater than or equal to four.

FIG. 1 exemplarily shows that the pixel electrode 10 includes eight sub-pixel electrode regions 11.

In an application, the sub-pixel electrode regions may be divided in any manner, that is, the sub-pixel regions in the pixel electrode may be arranged in any form as long as all the sub-pixel regions constitute a complete pixel electrode as a whole. The shape of the sub-pixel regions may also be arranged in any manner as long as different sub-pixel regions are not overlapped.

In an application, in order to make the liquid crystal molecules regularly tilt in a plurality of different directions after alignment, instead of disorderly tilting, the pixel electrode may be divided into a plurality of sub-pixel regions regularly arranged and symmetrically distributed as far as possible, and the sub-pixel regions should be arranged as a regular shape as far as possible, such as, a triangle, a quadrangle, a regular pentagon, or a regular hexagon or the like.

In FIG. 1, the sub-pixel electrode regions 11 are exemplarily shown to be rectangular.

As shown in FIG. 1, in the present embodiment, there are a closed electrode frame 111 and a plurality of orientated electrode lines 112 on the sub-pixel electrode regions 11; in which the closed electrode frame 111 is composed of a plurality of peripheral electrode lines connected end to end, and the adjacent sub-pixel electrode regions 11 share the same one peripheral electrode line.

The plurality of orientated electrode lines 112 are obliquely disposed within the closed electrode frame 111, and the plurality of orientated electrode lines 112 are parallel to each other with the same line spacing and the same line width.

In different sub-pixel electrode regions 11, the tilt direction, the line spacing, or the line width of the orientated electrode lines 112 is different.

In an application, the orientated electrode lines function by applying a voltage to its corresponding liquid crystal molecules to define the tilt direction of the corresponding liquid crystal molecules. Generally, the tilt direction of the liquid crystal molecules is the same as or corresponds to the corresponding orientated electrode lines.

In application, the wider the line width of the orientated electrode lines and the smaller the line spacing of the orientated electrode lines, the higher the transmittance of the corresponding liquid crystal pixel. Conversely, the smaller the line width and the larger the line spacing, the lower the transmittance of the corresponding liquid crystal pixel. The transmittance is equal to the sum of the areas of all the electrode lines of the sub-pixel electrode regions divided by the area of the sub-pixel electrode regions.

FIG. 1 exemplarily shows that among eight sub-pixel regions. The line width and the line spacing of the orientated electrode lines 112 within the upper four sub-pixel electrode regions 11 are the same, and the line width and the line spacing of the orientated electrode lines 112 within the lower four sub-pixel electrode regions 11 are the same.

In some embodiments, several sub-pixel electrode regions of the plurality of sub-pixel electrode regions constitute a main region of the pixel electrode, and the remaining sub-pixel electrode regions constitute a sub-region of the pixel electrode.

All sub-pixel electrode regions in the main region are adjacent to each other, and all sub-pixel electrode regions in the sub-region are adjacent to each other. The line spacing of the orientated electrode lines in the main region is larger than the line spacing of the orientated electrode lines in the sub-region, and the line width of the orientated electrode lines in the main region is larger than the line width of the orientated electrode lines in the sub-region.

By using the sub-pixel electrode regions having larger line width and larger line spacing as the main region, the high transmittance of the liquid crystal pixel region corresponding to the main region can be achieved, thereby reducing the color shift of the liquid crystal pixel region.

FIG. 1 exemplarily shows that the line width and the line spacing of the orientated electrode lines 112 within the upper four sub-pixel electrode regions 11 are larger than the line width and the line spacing of the orientated electrode lines 112 within the lower four sub-pixel electrode regions 11.

In an application, the tilt directions of the orientated electrode lines in each of the sub-pixel electrode regions may be arranged according to actual needs, and the tilt directions of the alignment electrode lines in different sub-pixel regions may be the same or different. In order to achieve a uniform and regular display effect on the pixels corresponding to the entire pixel electrode, the tilt directions of the orientated electrode lines in each of the sub-pixel electrode regions should be arranged as regularly as possible. For example, the orientated electrode lines within odd rows (or columns) of sub-pixel electrode regions are all inclined to the left by a certain angle, and the orientated electrode lines within even rows (or columns) of sub-pixel electrode regions are all inclined to the right by a certain angle. In the row or column direction, the orientated electrode lines in adjacent sub-pixel electrode regions are in the direction symmetrically distributed with respect to the common peripheral electrode lines.

FIG. 1 exemplarily shows that the orientated electrode lines within the adjacent sub-pixel electrode regions are symmetrically distributed with respect to the common peripheral electrode lines. The orientated electrode lines within the upper left corner sub-pixel electrode region are tilted to the left, and the orientated electrode lines within the upper right corner sub-pixel electrode region are tilted to the right. The tilt directions of the orientated electrode lines in other sub-pixel electrode regions may be deduced by analogy, and will not be described again here.

In an application, in order to reduce the color shift, the reduced color shift may be realized, in addition to through the structure shown in FIG. 1, by increasing the area of the main region and reducing the area of the sub-region as much as possible.

Figure 2:
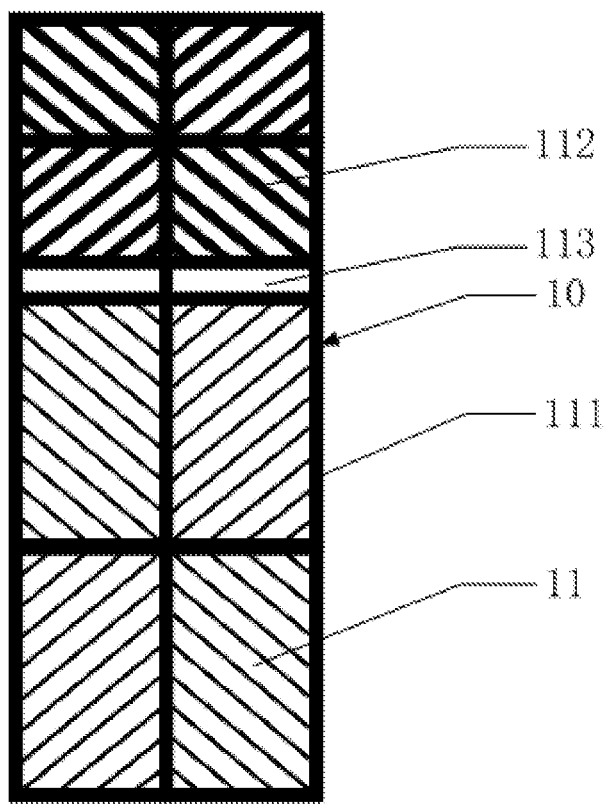
FIG. 2 is a structural schematic view of a pixel electrode provided in another embodiment of the present application.

As shown in FIG. 2, in some embodiments a slit 113 is formed on a peripheral electrode line at boundaries between the main region and the sub-region of the pixel electrode 10 as shown in FIG. 1. That is, a slit is formed on the peripheral electrode line between the sub-pixel electrode region at the second row and the first column and the sub-pixel electrode region at the third row and the first column, and a slit is formed on the peripheral electrode line between the sub-pixel electrode region at the second row and the second column and the sub-pixel electrode region at the third row and the second column.

In an application, the slit may be formed by a process such as hollowing out, etching, cutting, etc. on a complete peripheral electrode line or may be formed by leaving a certain gap between the two peripheral electrode lines. For the same principles, the slits on the entire pixel electrode may be formed by a process such as hollowing out, etching, cutting, etc. on a piece of complete pixel electrode or may be formed by leaving a certain gap between adjacent orientated electrode lines.

In the present embodiment, by leaving a certain gap between the main region and the sub-region, the tilt directions of the liquid crystal molecules between the main region and the sub-region can be prevented from interfering with each other.

In some embodiments, slits are formed on the peripheral electrode lines at the boundaries between adjacent sub-pixel electrode regions. By leaving a certain gap between any adjacent sub-pixel electrode regions, the tilt directions of the liquid crystal molecules between any adjacent sub-pixel electrode regions can be prevented from interfering with each other.

Figure 3:
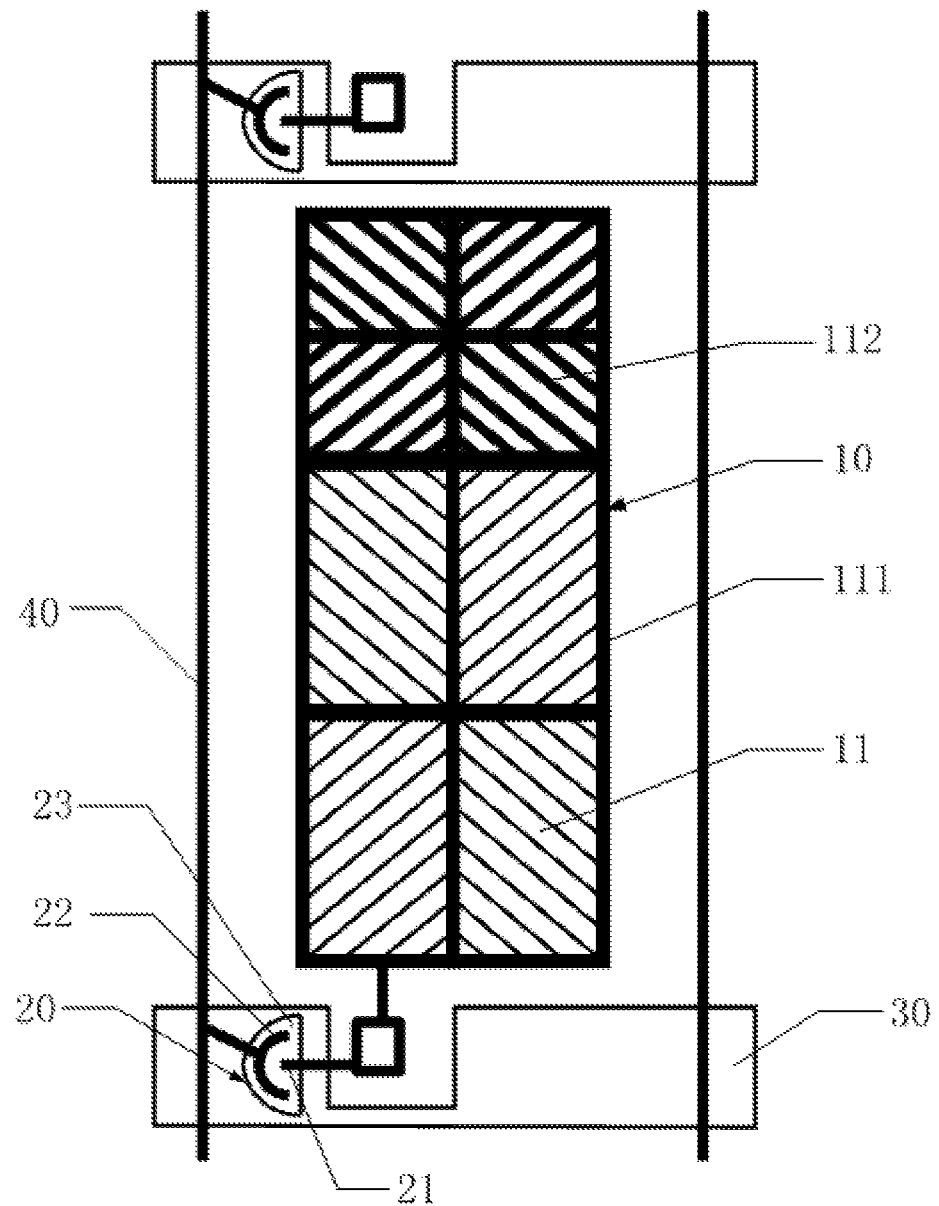
FIG. 3 is a structural schematic view of the pixel structure provided in an embodiment of the present application.
Figure 4:
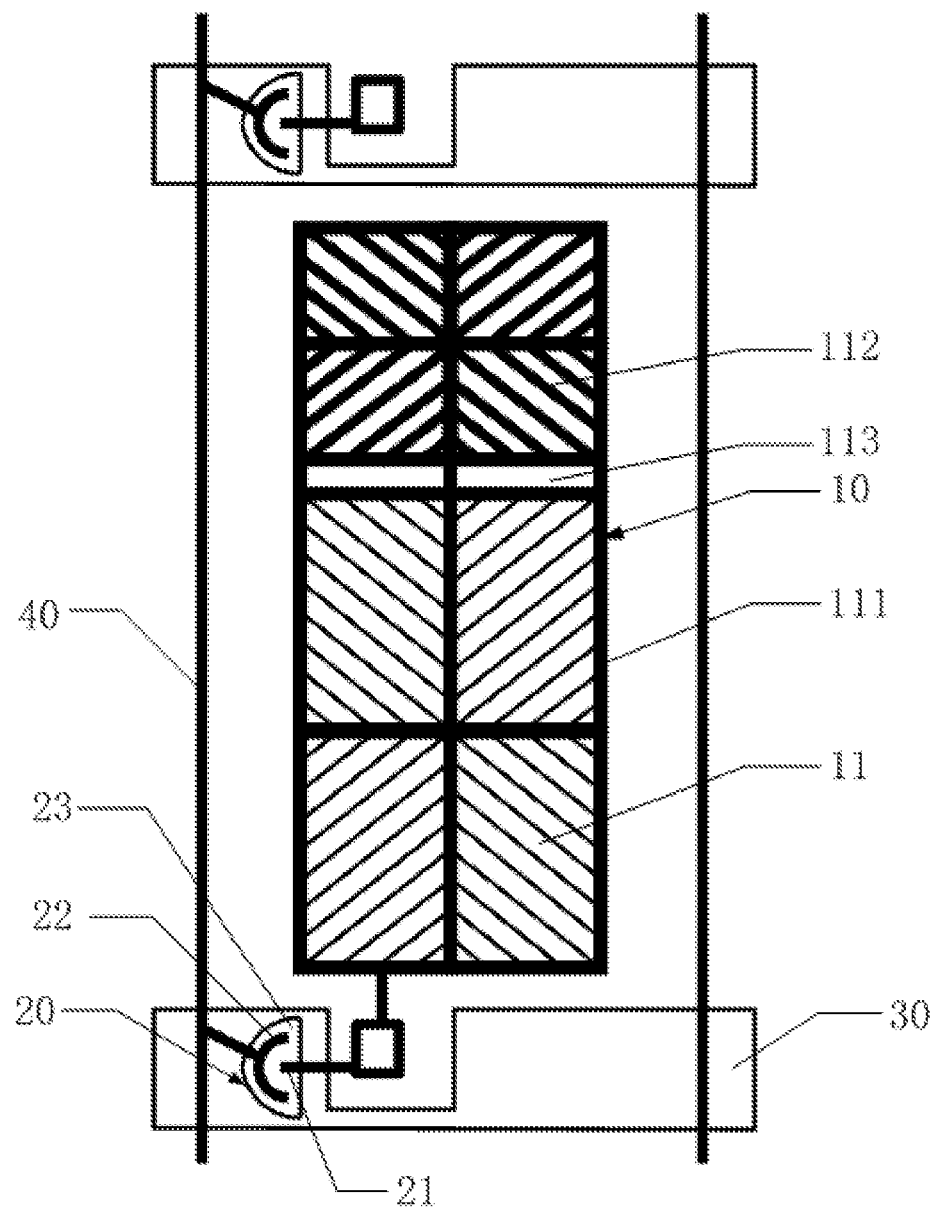
FIG. 4 is a structural schematic view of the pixel structure provided in another embodiment of the present application.

As shown in FIG. 3 or 4, some embodiments of the present application provide a pixel structure, which includes the above-described pixel electrode 10, an electronic switching device 20, a gate line 30, and a data line 40;

The pixel electrode 10 is electrically connected to the electronic switching device 20. The gate line 30 is disposed on one side of the pixel electrode 10 and electrically connected to the electronic switching device 20. The data line 40 is disposed on the other side of the pixel electrode 10 and is electrically connected to the electronic switching device 20.

As shown in FIG. 3 or 4, in the present embodiment, the electronic switching device 20 includes a gate (not shown), a drain 21, a source 22, and an active layer 23, and the active layer 23 is disposed between the gate, the drain 21 and the source 22, the gate is electrically connected to the gate line 30, the drain 21 is electrically connected to the pixel electrode 10, and the source 22 is electrically connected to the data line 40.

FIG. 3 exemplarily shows a pixel structure realized based on the pixel electrode as shown in FIG. 1, and FIG. 4 exemplarily shows a pixel structure realized based on the pixel electrode as shown in FIG. 2.

In an application, a parasitic capacitor is formed between the gate and the source of the electronic switching device.

In an application, the drain and the source are formed on a surface of the active layer, and the gate is formed on a lateral side of another surface of the active layer opposite to the source and the drain. The gate, the drain, and the source, together with the active layer, form the electronic switching device, the gate and the gate line are formed at the same layer, and the source and the data line are formed at the same layer.

In an application, the active layer is composed of multiple layers of different types of semiconductor materials, for example, an organic semiconductor active layer composed of three different types of semiconductor materials.

In some embodiments, the pixel structure further includes a gate insulation layer and a protective layer; wherein the gate insulation layer is disposed between the active layer, the gate, and the gate line; the protective layer is disposed between the pixel electrode, the data line, the source, and the drain, and the pixel electrode is electrically connected to the drain through a through hole of the protective layer.

In an application, the gate insulation layer is formed between the active layer and the gate, and the active layer and the gate are spaced apart to achieve insulation. The data line, the source, and the drain are formed on a lateral side of the protective layer, and the pixel electrode is formed on another lateral side of the protective layer. The protective layer is provided with a through hole, and the pixel electrode is electrically connected to the drain electrode through the through hole.

In some embodiments, the pixel structure further includes: a first orientated layer disposed on a lateral side of the protective layer opposite to the pixel electrode, wherein the first orientated layer is provided with a sealant, and the liquid crystal is instilled in the region formed by the sealant, and a second orientated layer, a common electrode, and a color film are sequentially disposed above the liquid crystal.

In an application, the electronic switching device is connected to only one gate line and one data line, that is, the pixel structure provided in the present embodiment includes only one gate line and one data line. The region where a pixel is located is usually a region surrounded by two gate lines and two data lines.

As shown in FIG. 3 or 4, two gate lines 30 and two data lines 40 are exemplarily shown; wherein one of the gate lines 30 is disposed at the upper side of the pixel electrode 10, and another gate line 30 is disposed at the lower side of the pixel electrode 10, one data line 40 is disposed on the left side of the pixel electrode 10, and the other data line 40 is disposed on the right side of the pixel electrode 10.

It should be understood that the intersection of the gate line and the data line in FIG. 3 or 4 only represents that the two lines intersect in position rather than being electrically connected.

Figure 5:
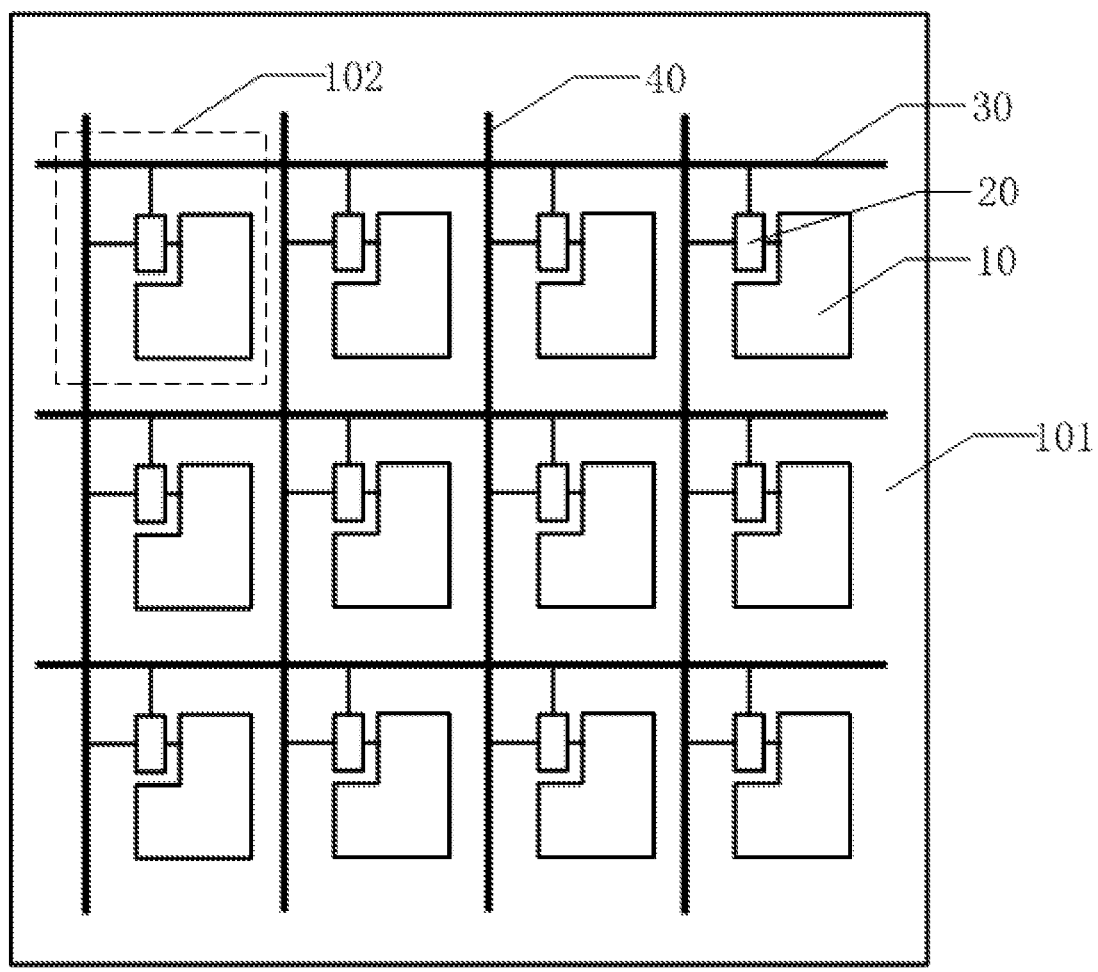
FIG. 5 is a structural schematic view of the array substrate provided by an embodiment of the present application.

As shown in FIG. 5, an embodiment of the present application further provides an array substrate, which includes: a substrate 101; and a plurality of the above pixel structures 102 are arranged on the substrate 101 and arranged in an array, wherein adjacent gate lines 30 are electrically connected to each other and adjacent data lines 40 are electrically connected to each other.

In an application, the substrate may be selected, according to actual needs, from any substrate able to be applied in a display device, for example, a glass substrate.

In an application, the plurality of the above pixel structures may be arranged on the substrate in any feasible array to form the array substrate, for example, it may be arranged as a rectangular array. When the electronic switching device is a TFT, the array substrate is a TFT array substrate.

As shown in FIG. 5, twelve pixel structures 102 arranged in a rectangular array are exemplarily shown.

In some embodiments, the gate of the electronic switching device, the gate insulation layer, and the gate lines are all formed on the substrate.

In the present embodiment, the tilt angle of the liquid crystal molecules is controlled by using the multi-domain pixel electrode structure in the display device, and one pixel electrode is only connected to one electronic switching device, thereby improving the aperture ratio of the display device and frame quality while reducing the color deviation.

The above description is only the alternative embodiments of the present application, and is not intended to limit the present application. Any modification, equivalent substitution and improvement made within the spirit and principles of the present application should be included in the scope of the present application.

What is claimed is:

1. A pixel structure, comprising:
    an electronic switching device;
    a pixel electrode electrically connected to the electronic switching device, wherein the pixel electrode comprises a plurality of sub-pixel electrode regions, wherein transmittances of the plurality of sub-pixel electrode regions are different from each other;
    a gate line disposed at a lateral side of the pixel electrode and electrically connected to the electronic switching device; and
    a data line disposed at another lateral side of the pixel electrode and electrically connected to the electronic switching device;
    wherein the electronic switching device comprises a gate, a drain, a source and an active layer, and the active layer is disposed between the gate, and the drain and the source; and the active layer is an organic semiconductor active layer composed of three layers of different types of semiconductor materials.

2. The pixel structure according to claim 1, wherein the sub-pixel electrode regions comprise:
  a closed electrode frame composed of a plurality of peripheral electrode lines connected end to end, wherein adjacent sub-pixel electrode regions share same one peripheral electrode line; and
  a plurality of orientated electrode lines obliquely disposed within the closed electrode frame, wherein the orientated electrode lines are parallel to each other with same line spacing and same line width.

3. The pixel structure according to claim 2, wherein several sub-pixel electrode regions constitute a main region of the pixel electrode, and the sub-pixel electrode regions not in the main region constitute a sub-region of the pixel electrode,
  wherein all sub-pixel electrode regions in the main region are adjacent to each other, and all sub-pixel electrode regions in the sub-region are adjacent to each other, and the line width of the orientated electrode lines in the main region is larger than the line width of the orientated electrode lines in the sub-region.

4. The pixel structure according to claim 3, wherein the number of sub-pixel electrode regions comprised in the main region is equal to the number of sub-pixel electrode regions in the sub-region.

5. The pixel structure according to claim 3, wherein the line spacing of the orientated electrode lines within the main region is larger than the line spacing of the orientated electrode lines within the sub-region.

6. The pixel structure according to claim 3, wherein a slit is formed on the peripheral electrode lines that form boundaries between the main region and the sub-region.

7. The pixel structure according to claim 6, wherein the slit is formed by a process selected from hollowing out, etching, and cuffing.

8. The pixel structure according to claim 2, wherein the orientated electrode lines in adjacent sub-pixel electrode regions are symmetrically distributed with regard to a common peripheral electrode line.

9. The pixel structure according to claim 2, wherein the number of sub-pixel electrode regions comprised in the pixel electrode is greater than or equal to four.

10. The pixel structure according to claim 2, wherein the tilt directions of the orientated electrode lines in different sub-pixel regions are different.

11. The pixel structure according to claim 2, wherein the orientated electrode lines within an odd row of sub-pixel electrode regions are inclined to the left, and the orientated electrode lines in an even row of sub-pixel electrode regions are inclined to the right;
  alternatively, the orientated electrode lines within an odd column of sub-pixel electrode regions are inclined to the left, and the orientated electrode lines in an even column of sub-pixel electrode regions are inclined to the right.

12. The pixel structure according to claim 2, wherein a slit is formed on the peripheral electrode lines that form boundaries between adjacent sub-pixel electrode regions.

13. The pixel structure according to claim 1, wherein
  the pixel electrode is electrically connected to the drain, the gate line is electrically connected to the gate, and the data line is electrically connected to the source.

14. The pixel structure according to claim 13, wherein the pixel structure further comprises:
  a gate insulation layer disposed between the active layer, and the gate and the gate line; and
  a protective layer disposed between the pixel electrode, and the data line, the source and the drain, wherein the pixel electrode is electrically connected to the drain through a through hole of the protective layer.

15. The pixel structure according to claim 13, wherein the drain and the source are formed on a surface of the active layer, wherein the gate is formed on a lateral side of another surface of the active layer opposite to the source and the drain, wherein the gate, the drain, the source, and the active layer form the electronic switching device, wherein the gate and the gate line are formed at the same layer, and wherein the source and the data line are for led at the same layer.

16. The pixel structure according to claim 1, wherein a parasitic capacitor is formed between the gate and the source of the electronic switching device.

17. An array substrate, comprising:
  a substrate; and
  a plurality of pixel structures disposed on the substrate and arranged in an array; and
  wherein each of the pixel structures comprises:
  an electronic switching device;
  wherein the electronic switching device comprises a gate, a drain, a source and an active layer, and the active layer is disposed between the gate, and the drain and the source; and the active layer is an organic semiconductor active layer composed of three layers of different types of semiconductor materials;
  a pixel electrode electrically connected to the electronic switching device, wherein the pixel electrode comprises a plurality of sub-pixel electrode regions, wherein transmittances of the plurality of sub-pixel electrode regions are different from each other;
  a gate line disposed at a lateral side of the pixel electrode and electrically connected to the electronic switching device; and
  a data line disposed at another lateral side of the pixel electrode and electrically coupled to the electronic switching device,
  wherein the gate lines that are adjacent to each other are electrically coupled, and
  wherein the data lines that are adjacent to each other are electrically coupled.

* * * * *